United States Patent
Wong

(10) Patent No.: US 7,023,217 B1
(45) Date of Patent: Apr. 4, 2006

(54) METHOD AND APPARATUS FOR DETERMINING WEAR OF RESISTIVE AND CONDUCTIVE ELEMENTS

(75) Inventor: Sherman S. L. Wong, Vancouver (CA)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 11/016,178

(22) Filed: Dec. 16, 2004

(51) Int. Cl.
*G01R 31/08* (2006.01)
*G01R 31/327* (2006.01)
*G01R 31/02* (2006.01)

(52) U.S. Cl. .................. 324/522; 324/424; 324/539

(58) Field of Classification Search ............. 324/522, 324/512, 500, 455, 456, 420, 600, 536, 557, 324/240, 537, 539, 418–424
See application file for complete search history.

(56) References Cited

U.S. PATENT DOCUMENTS

| | | | |
|---|---|---|---|
| 3,988,666 A | 10/1976 | Rowland et al. ............... 324/54 |
| 4,160,947 A * | 7/1979 | Tanno et al. ................. 324/539 |
| 4,477,769 A | 10/1984 | Lowery et al. ................ 324/54 |
| 4,700,042 A * | 10/1987 | Ferrero et al. ............... 219/110 |
| 4,827,121 A | 5/1989 | Vidrine et al. ............... 250/227 |
| 5,015,859 A | 5/1991 | Uejio ......................... 250/358.1 |
| 5,541,509 A | 7/1996 | Kyriakis ..................... 324/230 |
| 5,982,568 A * | 11/1999 | Yamamoto et al. .......... 360/31 |
| 6,017,258 A | 1/2000 | Sakurai et al. .............. 445/32 |
| 6,034,531 A | 3/2000 | Senglat et al. .............. 324/699 |
| 6,215,315 B1 | 4/2001 | Maejima et al. ............. 324/539 |
| 6,290,027 B1 | 9/2001 | Matsuzaki ................... 188/1.11 |
| 6,294,912 B1 | 9/2001 | Kwun ........................ 324/240 |
| 6,361,205 B1 * | 3/2002 | Andersen .................... 374/45 |
| 6,465,949 B1 | 10/2002 | Miahara et al. ............. 313/493 |
| 6,466,023 B1 * | 10/2002 | Dougherty et al. .......... 324/424 |
| 6,483,302 B1 | 11/2002 | Rusnell et al. .............. 324/232 |
| 6,624,577 B1 | 9/2003 | Meszaros ..................... 313/633 |
| 6,777,948 B1 | 8/2004 | Dominelli et al. ........... 324/455 |

FOREIGN PATENT DOCUMENTS

| | | |
|---|---|---|
| WO | WO 01/42802 | 6/2001 |
| WO | WO 01/55618 | 8/2001 |
| WO | WO 01/63976 | 8/2001 |
| WO | WO 01/69269 | 9/2001 |

(Continued)

OTHER PUBLICATIONS

Hofstoetter, Peter, et al.., *Application of the Potential Drop Method for In-Service Monitoring of Indications For Crack Initiation or Crack Propagation-Fundamental Priniciples And Practical Application*, Transactions, SMiRT 16, Paper #1880, Washington DC, Aug. 2001.

(Continued)

*Primary Examiner*—Vincent Q. Nguyen
*Assistant Examiner*—Hoai-An D. Nguyen
(74) *Attorney, Agent, or Firm*—Cascio Schmoyer & Zervas; Anthony Miologos

(57) ABSTRACT

According to one embodiment, the present invention provides a system for determining wear of an electrical element. The system includes a current source, a voltmeter and a control unit. The control unit is operable to couple the current source and the voltmeter to a first spare electrical element in a device under test, determine a characteristic physical property of the first spare electrical element and determine a wear characteristic for a primary electrical element in the device under test based upon the characteristic physical property of the first spare electrical element.

14 Claims, 6 Drawing Sheets

FOREIGN PATENT DOCUMENTS

| | | |
|---|---|---|
| WO | WO 01/48117 A3 | 11/2001 |
| WO | WO 02/086349 | 10/2002 |
| WO | WO 03/016890 | 2/2003 |
| WO | WO 2004/051293 A1 | 6/2004 |
| WO | WO 04/070401 | 8/2004 |
| WO | WO 2004/075213 | 9/2004 |
| WO | WO 2004/088338 | 10/2004 |

OTHER PUBLICATIONS

Stander, Jennifer, et al., *Multiprobe Impedance Measurement System for Nondesctructive Evaluation and Test of "Green State" Power Metallurgy Parts*, IEEE Transactions On Instrumentation and Measurement, vol. 47, No. 5, pp. 1367-71, Oct. 1998.

* cited by examiner

METHOD AND APPARATUS FOR DETERMINING WEAR OF RESISTIVE AND CONDUCTIVE ELEMENTS

FIELD OF THE INVENTION

The present invention relates to the real-time detection of wear in electrical conductors and particularly to nondestructive methods of diagnosing degradation in electrical wiring including, for example, continuously moving cables such as those used in power track applications.

BACKGROUND OF THE INVENTION

Detection of wear in electrical conductors such as insulated wires is critical to avoid simple inconvenience and, in some instances, catastrophic system failure. Electrical cables typically consist of a conductor, such as a metallic wire or a plurality of wires, that is insulated with a jacket or sheath around the circumference of the wire. The insulating material can be plastic, rubber, and the like. Power chains have either relatively flat or cylindrical, elongated structures that consist of a series of long, parallel conductors that are separated from one another by an insulating material.

Power chains are incorporated into moving machinery such as robotics and are subject to fatigue as they undergo cyclic motion, as well as by abrasion, impact or tension overload. There exists a need to determine wear in electrical conductors and in particular those that are subject to constant frictional forces such as continuously moving cables. Aside from programmed maintenance and inspection, the most common method of detecting cable wear entails deploying one or more "wear conductors" along strategic positions in the cable that appear to be subject to the most severe wear. Wear can be inferred to occur when an electrically open circuit from a broken conductor is detected. See, for example, U.S. Pat. No. 6,034,531 to Senglat et al. and U.S. Pat. No. 6,215,315 to Mitsuru Maejima, WO 01/84117 to Pierre et al. and WO 01/42802 to Harry Orton. A major shortcoming of this approach is that the sensing of broken conductors does not lend itself to monitoring progressive wear. Some cable manufacturers also measure cable resistance during life cycle testing; in most cases, this is a static procedure that employs a basic ohmmeter and that is performed when the test equipment is shut down. Finally, prior art methods that endeavor to predict cable wear by measuring resistance do not adequately compensate for temperature fluctuations in the cables being monitored.

U.S. Pat. No. 6,777,948 to Dominelli et al. describes a method of detecting wear in components of high voltage electrical equipment by embedding a tracer material that emits electromagnetic radiation into the components at predetermined depths therein. As the components degrade, the tracer material can be detected when it is exposed to an electrical arc. Introducing tracer materials is not practical for many applications and can actually interfere with the operations of many electrical conductors.

U.S. Pat. No. 5,015,859 to Wayne H. Uejio describes a method of detecting wear of electrical conductors such as insulated wires by wrapping an optical fiber around the article and measuring the transmission of light through the optical fiber. Increased transmission loss is said to indicate wear of the article. Incorporating optical fibers, which are very fragile, into moving power chains is not feasible for many applications and would be cost prohibitive.

SUMMARY OF THE INVENTION

The present invention is based in part on the recognition that accurate and precise dynamic measurements of electrical cable wear can be attained by measuring minute changes in cable resistance over time. The measurements, which can be continuous or performed at regular time intervals, can be used to predict the degree or rate of wear in the cables. Besides providing real-time measurements, another advantage of the invention is that temperature variations in the cable being monitored or in its environment are accounted for and therefore measurements are not adversely affected by temperature fluctuations. Another advantage of the present invention is that it is not necessary to take the device under test out of service in order to conduct the wear measurements.

In one embodiment, the present invention provides a system for determining wear of an electrical element. The system includes a current source, a voltmeter and a control unit. The control unit is operable to couple the current source and the voltmeter to a first spare electrical element in a device under test, determine a characteristic physical property of the first spare electrical element and determine a wear characteristic for a primary electrical element in the device under test based upon the characteristic physical property of the first spare electrical element. In various embodiments, characteristic physical properties may include at least one of a resistance, a capacitance, and an inductance and other measurable physical characteristics are contemplated.

In another embodiment, the present invention provides a system for determining wear of an electrical element. The system includes an electrical source; at least one electrical measuring device, operable to measure an electrical quantity relating to an electrical element under test and a spare electrical element. The spare electrical element is exposed to substantially similar environmental factors as the electrical element under test except that the spare electrical element is not subject to wear. A characteristic physical property of the electrical element under test is determined based upon indications from the electrical measuring device when the electrical measuring device and the electrical source are coupled to the electrical element under test and the spare electrical element. A wear characteristic for the electrical element under test is determined based upon the characteristic physical property of the electrical element under test compensated for environmental factors affecting the electrical element under test and the spare electrical element. The environmental factors are determined based upon the characteristic physical property of the spare electrical element.

In one embodiment, the electrical element under test is coupled with the spare electrical element in a series circuit configuration, in which case the electrical source is a constant current source and the electrical measuring device is a voltmeter configured to measure voltage across at least the electrical element under test.

In an alternative embodiment, the electrical element under test is coupled with the spare electrical element in a parallel circuit configuration, in which case the electrical source is a voltage source and the electrical measuring device is an ammeter configured to measure current flow through at least the electrical element under test.

In a further embodiment, the present invention provides a method for determining wear of an electrical element. The method includes applying a current to an electrical element under test. A voltage across the element under test is measured. From the voltage across the element under test, a characteristic physical property of the element under test is determined. Differences in the characteristic physical property due to at least one environmental factor are compensated for in order to obtain a corrected characteristic physical property. A wear characteristic of the electrical element is determined from changes in the corrected characteristic physical property in successive iterations of the foregoing applying, measuring, determining and compensating steps.

While the measurement techniques are particularly suited for detecting wear in power chains and the like which are constantly moving and exposed to frictional forces, the invention is applicable to any metallic or non-metallic electrical conductor and semiconductor, regardless of whether the conductor or semiconductor is moving or not. For example, wire filaments in lamps and electric resistance heaters can be monitored as well.

DETAILED DESCRIPTION OF PREFERRED EMBODIMENTS

Figure 1A:
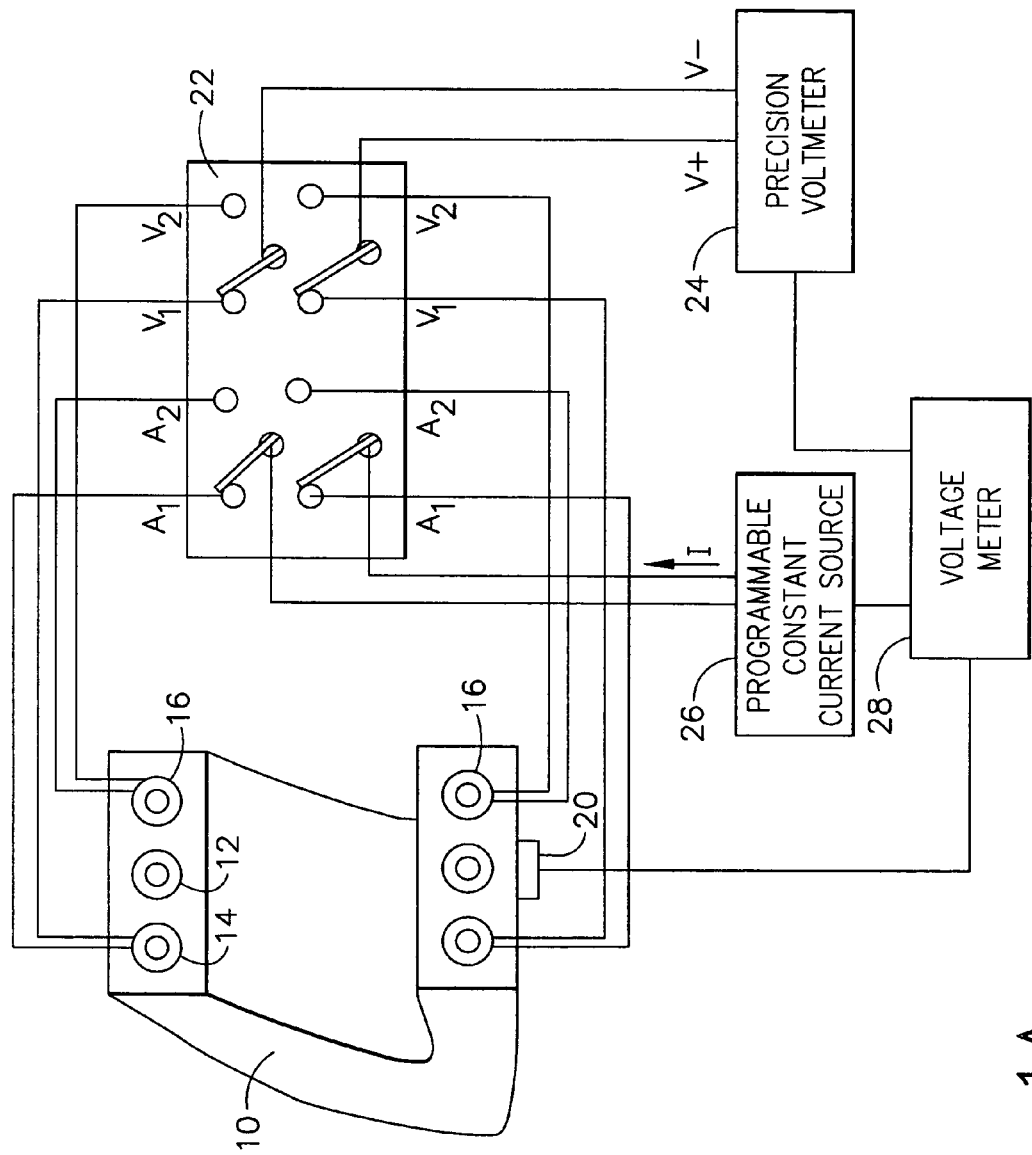
FIGS. 1A, 2A, and 3A are schematic diagrams of real-time resistance measurement configurations.

FIG. 1A illustrates an embodiment of the invention for determining progressive damage in electrical conductors. The embodiment illustrated by FIG. 1A employs a technique in which accumulated damage in the primary conductor or conductors can be inferred by measuring the resistance changes in spare conductors of the same cross section in the same bundle within the power track or drag train assembly. The useful remaining life of the drag chain can thus be predicted from the inferred accumulated damage. As shown in FIG. 1A, the representative drag train assembly 10 includes a single primary conductor 12 and two spare conductors 14, 16. A current, I, is injected by the programmable constant current source 26 into a selected spare conductor through a switch or relay 22. The resulting voltage across the ends of the spare conductor is measured through a second set of leads by a precision voltmeter 24. In this fashion, once the current is known precisely, the resistance of a wire that is not measurable by ordinary means, due to varying contact pressure of the measurement probes, is readily and consistently calculated to small fractions of an ohm.

Temperature effects on the resistance of the conductors are compensated by measuring the temperature with thermal sensor 20 at a point or at various points along the drag train assembly and using known temperature coefficients for the conductor material to calculate a temperature-change induced variation in resistance. This induced variation may be used to compensate the measured resistance change by using well-known relationships between temperature and resistance and taking into account the temperature coefficient of the material. A data-logging device 28 records the voltage, current, and temperature data. Periodic measurements of the voltage, current and temperature values can be used to calculate the change in resistance as a function of time. If the change in resistance with accumulated damage is known, then the measured resistance changes can be used to infer remaining useful life.

In the device shown in FIG. 1A, the spare conductor that is used for the measurements can be changed from spare conductor 14 to spare conductor 16 through the interconnected switch or relay 22. Specifically, several conductors may be measured in rapid sequence, by switching wires in and out of a circuit. By averaging a plurality of measurements, a more reliable prediction can be obtained. As illustrated, the programmable current source 26 is connected to spare conductor 14 through the contacts $A_1$ and the precision voltmeter 24 is connected to the spare conductor 14 through the contacts $V_1$. Spare conductor 16 can be used for the measurements by switching to $A_2$ and $V_2$ contacts. This can be done under computer control to provide measurements from both spare conductors for averaging.

Figure 1B:
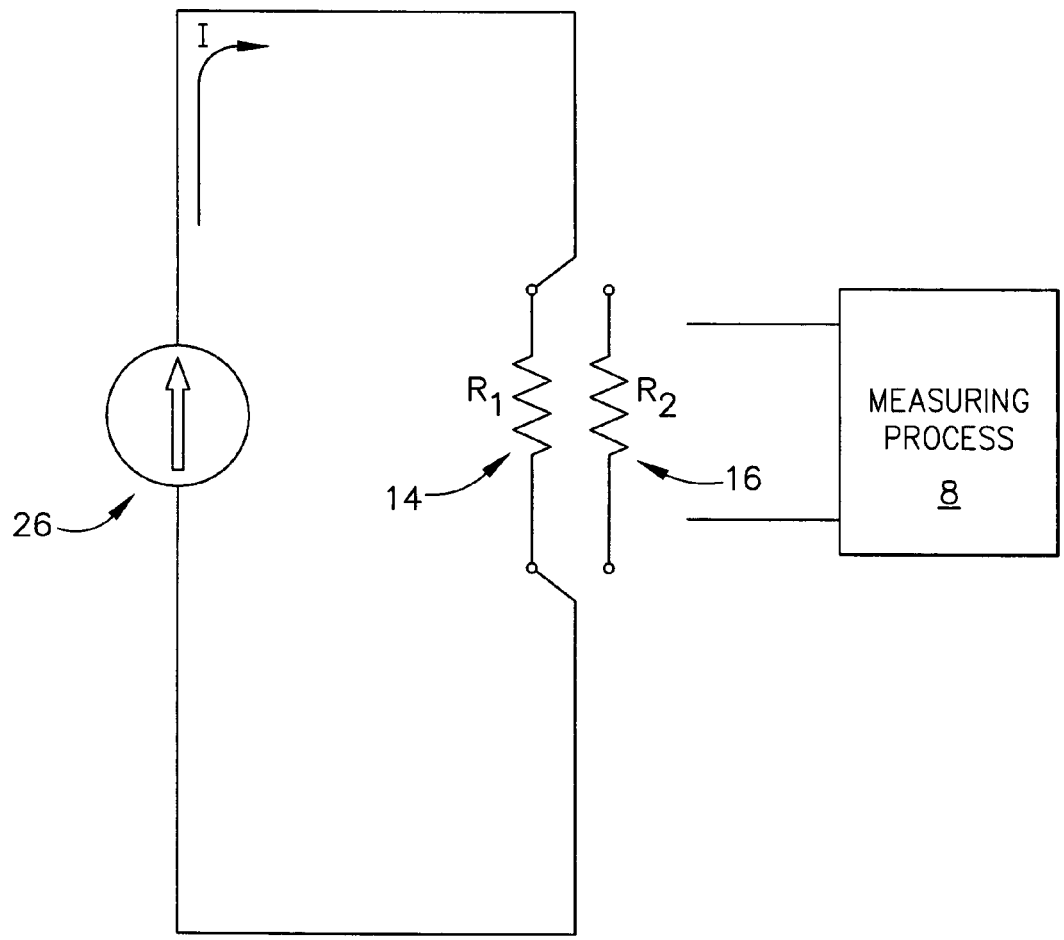
FIGS. 1B, 2B, and 3B are the equivalent circuits of the configurations of FIGS. 1A, 2A, and 3B, respectively.

FIG. 1B shows an electrical circuit diagram demonstrating voltage, current and resistance relationships that can exist in one embodiment of the device illustrated by FIG. 1A. As shown, FIG. 1B includes a plurality of spare conductors 14 and 16, which are individually represented as resistors $R_1$, and resistor $R_2$, respectively. As the known, constant current I is injected into a selected spare conductor, the resulting voltage across the conductor is measured by the measuring process 8. The magnitude of the current source is chosen to be as small as practical so as to minimize the internal heating of the conductor. For very small resistances, the current source must be quite large; in these instances constant current pulses should be used together with voltage sampling instruments. Since the voltage across a spare conductor 14 in normal operating conditions is a linear function of the resistance and the current I, the resistance ($R_1$) and thus the resistance change can be monitored in real-time by using the measuring process 8 by measuring the voltage across the spare conductor 14 and computing the resistance of the spare conductor 14 based upon the known constant current I.

Figure 2A:
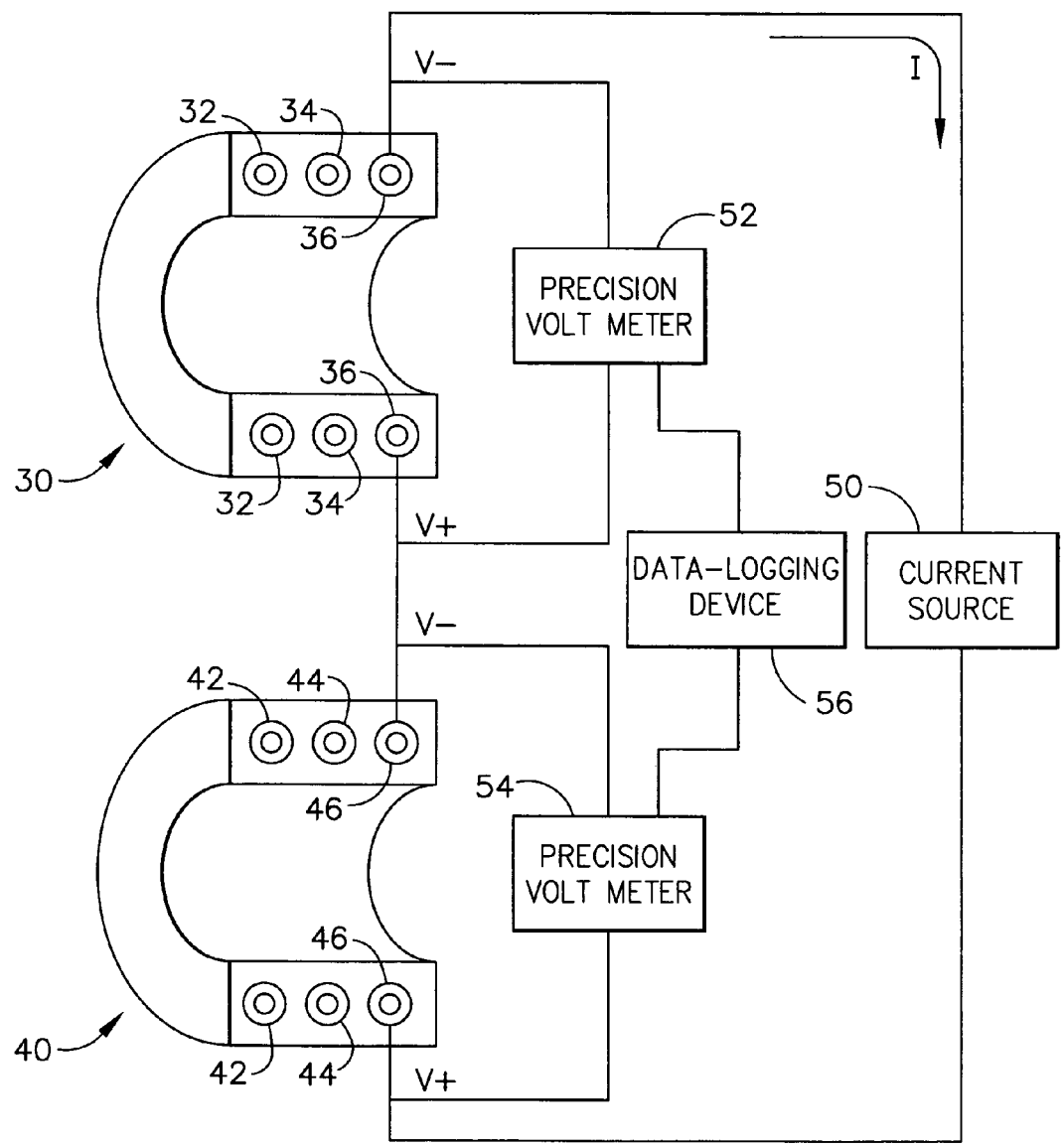

FIG. 2A illustrates an embodiment of the invention for measuring wear in of a drag chain cable 30 which includes a plurality of conductors 32, 34, and 36 that are separated by insulation material. Conductors 32, 34, and 36 may be conductors in a commercially available ribbon-type cable, for example. A reference cable 40 is located at a fixed position that is remote from the cable 30 such that reference cable 40 is not subject to the same mechanical stresses that the moving test cable 30 is exposed to. The reference cable 40 is maintained at the same temperature as that of the test cable 30. This is readily accomplished when the reference and test cables are in close proximity to each other, otherwise, a heater or cooling device can be employed to stabilize the temperature of both the test cable 30 and reference cable 40. The reference cable 40 can be identical to that of the test cable 30 or it can be just a stationary segment of one conductor out of the plurality of conductors in test cable. The reference cable is used as a standard and its length is not critical so long as the reference cable has the substantially similar basic composition as that of the test cable and both are essentially measured in a substantially similar environment and at a substantially similar temperature. In this example, the reference cable is selected to be the same as that of the test cable 30. Specifically, the reference cable 40 includes a plurality of conductors 42, 44, and 46. In this illustration, the conductor 36 of the test cable 30 is being monitored for wear so the conductor 36 is connected to the conductor 46 of reference cable 40.

The measurement assembly further includes a current source 50 that is connected in a series circuit to both the conductors 36 and 46 in a series circuit. One feature of this embodiment is that the current source 50 need not supply a constant current that is extremely stable over the short term during measurements. Precision voltmeters 52 and 54 measure the voltage drops across the conductors 36 and 46, respectively. Because these voltage drop measurements are extremely fast and are virtually instantaneous, any short-term current variations are either negligible or may be compensated for using statistical methods. A data-logging device 56, such as a personal computer with the appropriate data recording software, records the voltage drops and currents. Statistical averaging of several readings for the same cable measurement should yield highly repeatable results, which along with the benefit of virtual real-time measurements would offset or negate the effects of temperature drift and current source drift. The voltage drop across the reference standard is preferably normalized for both variations in temperature and "constant" current. The result is that it is only necessary to measure voltage accurately; it is not necessary to measure the current in a practical application.

When the reference standard cable is measured at the same constant, mild temperature, e.g., 20° C., its resistance should not change for the life of the equipment provided that there is no extreme shock or physical damage to the reference cable. In practice, it is not necessary to monitor or regulate the reference cable temperature; indeed, it is not critical to even know what the actual temperature is when making the voltage drop or resistance measurements. As the moving drag chain 30 wears away and periodic measurements are made to determine wear, the resistance measurements can be normalized. This effectively permits comparison of the wear in the fixed reference drag chain 40 to that of the moving test drag chain 30 at a single fixed temperature, e.g., 20° C. In the event that there is no cable wear, measured resistance changes are attributable essentially to temperature effects and such resistance changes typically increase linearly over a finite span in proportion with increases in temperature. For materials with a non-linear characteristic, temperature curves may be obtained beforehand. Appropriate corrections to the resistance measurements can be made in order to account for temperature fluctuations in the moving drag chain. Once this temperature correction is implemented, any measured increase in resistance indicates the presence of actual cable wear in the moving test drag chain 30.

Figure 2B:
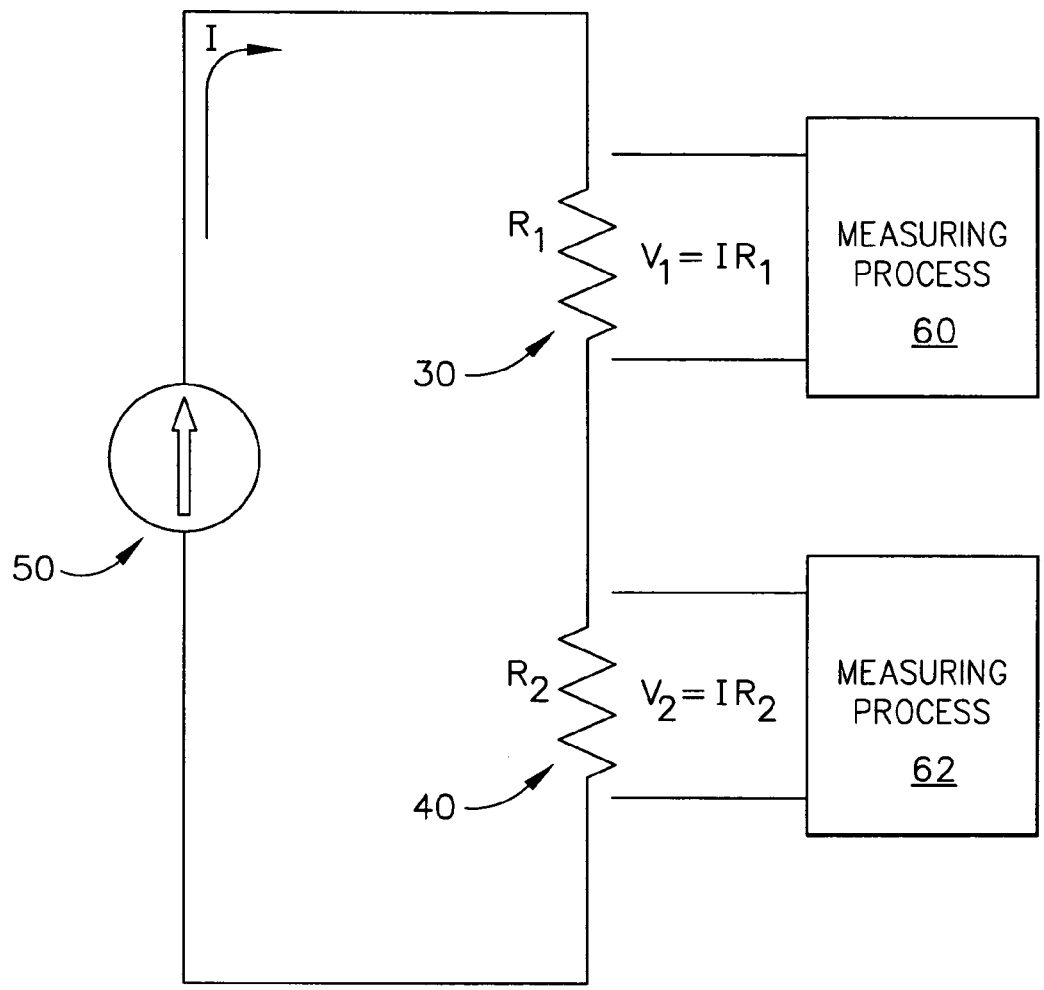

FIG. 2B shows an electrical circuit diagram demonstrating voltage, current and resistance relationships that can exist in one embodiment of the device illustrated by FIG. 2A. As shown, FIG. 2B includes moving drag chain 30, which is represented by $R_1$, and fixed reference drag chain 40, which is represented by $R_2$. As current I from the current source 50 flows through the circuit, the voltage drops across resistances $R_1$ and $R_2$ are measured by measuring processes 60 and 62, respectively. Measuring processes may also be configured in a differential measurement mode, and may be realized practically using a single instrument-grade operational amplifier circuits rather than two separate voltmeter circuits. Temperature dependent effects are compensated for by comparing the difference between resistance subject to wear, chain 30, with the resistance not subject to wear, chain 40, provided that each of the chains 30 and 40 are subject to substantially the same ambient temperature. One advantage of this technique is that the voltage in the two resistances, chain 30 and chain 40, may be measured at substantially the same time. This enables a relatively less stable current source to be used for current source 50. When it is necessary to detect minute changes in a test conductor, e.g., cable wear, using a constant-current power source will facilitate measurement.

While the embodiments depicted in FIGS. 2A and 2B employ direct current (dc), it is understood that alternating current (ac) can be employed instead in embodiments having appropriate modifications made to the measuring instruments/devices. The alternating frequency must be sufficiently low in order to minimize the effects of stray capacitance and inductance; otherwise pure resistance calculations cannot be made.

As is apparent from the electrical circuit diagram shown in FIG. 2B, a measuring process can be employed to gauge the deterioration of any conductor or semiconductor component, especially replaceable components that have a limited useful life in comparison to the life device in which they are incorporated. For example, high intensity incandescent (halogen) lamps employ filaments, e.g., tungsten filaments, that operate at temperatures typically between 2900° K and 3200° K. The lifetime of these filaments tends to decrease dramatically with high temperature operations or with uneven temperature distribution across the lamp due to uneven cooling. The effect is largely due to the sagging of the filament. The filaments are stressed or diminished in life merely by being heated to these high temperatures whereby the filaments literally "boil off" the metal particles which result in notching and eventual failure.

To measure the remaining useful life of a lamp in one embodiment, lamps can be fabricated with two filaments, namely an operational filament which is energized to glow and a reference filament which is a physical continuation of the first filament that provides a standard element that is not subject to any electrical load or stress apart from the measurement signals. These two filaments correspond to $R_1$ and $R_2$, respectively, of the electrical circuit shown FIG. 2B. By measuring the resistance changes in $R_1$ as described above, the useful life of the lamp can be determined, typically every time prior to the lamp being turned on.

Figure 3A:
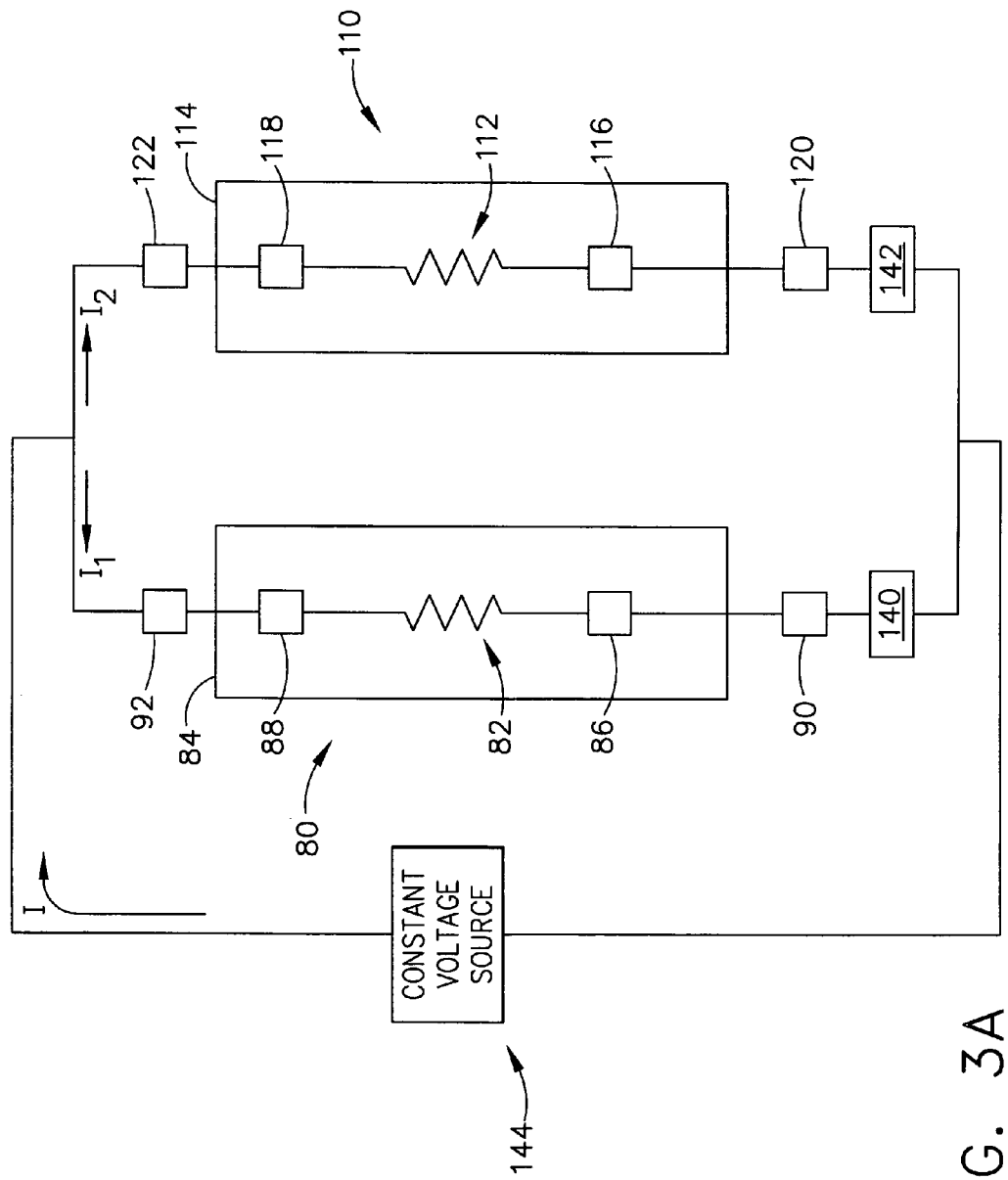

FIG. 3A illustrates another embodiment of the invention to measure wear of a conductor. In this case, a technique of monitoring degradation is applied to a test halogen lamp 80 that includes a metal, e.g., tungsten, coil filament 82 that is encased in a glass envelope 84. The ends of the filament 82 are welded to contact plates 86 and 88 which can be made of molybdenum. The contact plates 86 and 88 are connected to electrodes 90 and 92, respectively. A reference halogen lamp 110, which has the same configuration as that of the halogen lamp 80 under test is employed. The reference halogen lamp 110 includes a coil filament 112 the ends of which are welded to contact plates 116 and 118, which are connected to electrodes 120 and 122, respectively. The filament 112 and contact plates 116 and 118 are encased in a glass envelope 114.

The test and reference halogen lamps 80 and 110 are coupled in a parallel configuration to a constant voltage source 144. The voltage drops across test lamp 80 and reference lamp 110 will be the same. Initially, the current flowing through the test lamp 80 and the reference lamp 110 will also be the same but as wear in the test lamp 80 accumulates, the resistance of the test lamp 80 will increase. Accordingly, the current flowing through the test lamp 80, as measured by ammeter 140, will differ from the current flowing through the reference lamp 110, as measured by ammeter 142. The reference lamp 110 is not used for illumination so that its resistance is presumed not to change significantly over time. Thus, changes in the current flow through the test lamp 80 relative to the current flow through the reference lamp 110 will vary as the resistance of test lamp 80 changes over time due to degradation. Effects caused by changes in temperature can made to be the same for both the test and reference lamps by positioning both in similar environments.

Figure 3B:
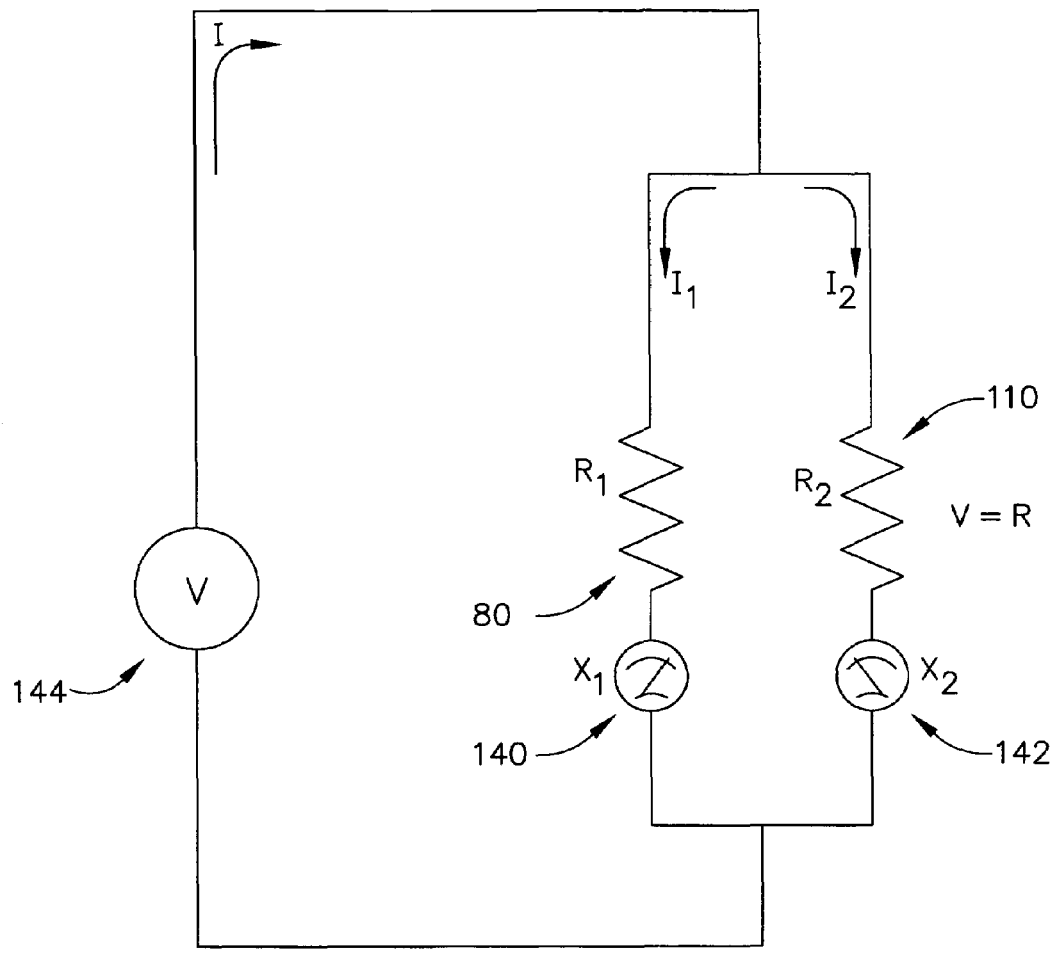

FIG. 3B shows an electrical circuit diagram demonstrating voltage, current and resistance relationships that can exist in one embodiment of the device illustrated by FIG. 3A. As shown, FIG. 3B includes test halogen lamp 80 and reference halogen lamp 110. As is apparent, other conductor or semi-conductor devices can be tested instead of the halogen lamp. The device under test is represented by a first resistance $R_1$ and a reference spare conductor is represented by a second resistance $R_2$. The device under test $R_1$ and reference $R_2$ are coupled in a parallel configuration to the constant voltage source 144. In this configuration, changes in the current $I_1$ through $R_1$ and current $I_2$ through $R_2$ are detected using one or more ammeters 140 and 142, respectively. Alternatively, a differential current measurement, using an instrument-grade current transformer coupled to measure the difference current between $I_1$ and $I_2$ flowing during test, will permit a single measurement to be used for determining resistance variations. One advantage of the measurement configuration illustrated in FIG. 3B is that it does not require a switching network or relay to perform measurements. Provided that the device under test $R_1$ and the reference $R_2$ are similarly situated physically to be exposed to the same temperature variations, and the device under test and the reference are selected such that the resistance variation with temperature of $R_1$ and $R_2$ is approximately the same, then the changes in current flow $I_1$ through $R_1$ relative to current flow $I_2$ through $R_2$ due to temperature will tend to be the same. Accordingly, changes in current flow $I_1$ and $I_2$ will be due substantially to changes in resistance $R_1$ due to usage.

The invention is illustrated by way of example and not by way of limitation in the figures of the accompanying drawings in which like references indicate similar elements. References to embodiments in this disclosure are not necessarily to the same embodiment, and such references mean at least one. While specific implementations are discussed, it is understood that this is done for illustrative purposes only. A person skilled in the relevant art will recognize that other components and configurations may be used without departing from the scope and spirit of the invention.

What is claimed is:

1. A system for determining wear of an electrical element, the system comprising:
    a current source;
    a voltmeter;
    a control unit operable to couple the current source and the voltmeter to a first spare electrical element in a device under test, determine a characteristic physical property of the first spare electrical element; and determine a wear characteristic for a primary electrical element in the device under test based upon the characteristic physical property of the first spare electrical element; and
    a switching network operable to couple the current source and the voltmeter to a second spare electrical element in the device under test, the second spare electrical element exposed to substantially similar environment factors as the first spare electrical element except that the second spare electrical element is not exposed to wear factors thereby enabling wear of the primary electrical element to be determined based upon measurements from the first spare electrical element compensated for environmental factors affecting the first spare electrical element and the second spare electrical element.

2. The system of claim 1, wherein determining a characteristic physical property of the first spare electrical element comprises determining from the voltage across the electrical element at least one of a resistance, a capacitance, and an inductance.

3. The system of claim 1, wherein the second spare electrical element exposed to substantially similar environment factors as the first spare electrical element includes the second spare electrical element being exposed to a similar temperature as the first spare electrical element.

4. The system of claim 1, wherein the first spare electrical element comprises at least one of a conductor in a power track and a filament.

5. A system for determining wear of an electrical element, the system comprising:
    an electrical source;
    at least one electrical measuring device, operable to measure an electrical quantity relating to an electrical element under test; and
    a spare electrical element, the spare electrical element exposed to substantially similar environmental factors as the electrical element under test except that the spare electrical element is not subject to wear;
    wherein a characteristic physical property of the electrical element under test is determined based upon indications from the at least one electrical measuring device when the electrical measuring device and the electrical source are coupled to the electrical element under test and the spare electrical element; and
    wherein a wear characteristic for the electrical element under test is determined based upon the characteristic physical property of the electrical element under test compensated for environmental factors affecting the electrical element under test and the spare electrical element, the environmental factors determined based upon the characteristic physical property of the spare electrical element.

6. The system of claim 5, wherein the characteristic physical property of the electrical element comprises at least one of a resistance, a capacitance, and an inductance.

7. The system of claim 5, wherein the electrical source is a constant current source, the electrical measuring device is a voltmeter configured to measure voltage across at least the electrical element under test, and wherein the electrical element under test is coupled with the spare electrical element in a series circuit configuration.

8. The system of claim 5, wherein the electrical source is a voltage source, the electrical measuring device is an ammeter configured to measure current flow through at least the electrical element under test, and wherein the electrical element under test is coupled with the spare electrical element in a parallel circuit configuration.

9. The system of claim 5, wherein environmental factors affecting the electrical element under test and the spare electrical element includes the electrical element under test and the spare electrical element being exposed to a similar temperature.

10. The system of claim 5, wherein the element under test comprises at least one of a conductor in a power track and a filament.

11. A method for determining wear of an electrical element, the method comprising:
    providing an electrical source;
    providing at least one electrical measuring device, operable to measure an electrical quantity relating to an electrical element under test; and
    providing a spare electrical element, the spare electrical element exposed to substantially similar environmental factors as the electrical element under test except that the spare electrical element is not subject to wear;

coupling the electrical measuring device and the electrical source to the electrical element under test and the spare electrical element;

applying a current to the electrical element under test;

measuring a voltage across the element under test;

determining a characteristic physical property of the element under test from the voltage across the element under test; and determining a wear characteristic for the electrical element under test based upon the characteristic physical property of the electrical element under test compensated for environmental factors affecting the electrical element under test and the spare electrical element, the environmental factors determined based upon the characteristic physical property of the spare electrical element.

12. The method of claim 11, wherein determining from the voltage across the element under test a characteristic physical property of the element under test, comprises:

determining from the voltage across the element under test at least one of a resistance, a capacitance, an inductance.

13. The method of claim 11, wherein compensating for differences in the characteristic physical property due to at least one environmental factor to obtain a corrected characteristic physical property, comprises:

compensating for differences in the characteristic physical property due to temperature.

14. The method of claim 11, wherein the electrical element under test comprises at least one of a conductor in a power track and a filament.

* * * * *